United States Patent [19]

Fukasawa et al.

[11] Patent Number: 4,966,676
[45] Date of Patent: Oct. 30, 1990

[54] SPUTTERING TARGET

[75] Inventors: Yoshiharu Fukasawa; Satoshi Yamaguchi; Hideo Ishihara, all of Tokyo, Japan

[73] Assignee: Kabushiki Kaisha Toshiba, Kanagawa, Japan

[21] Appl. No.: 345,175

[22] Filed: May 1, 1989

[30] Foreign Application Priority Data

May 16, 1988 [JP] Japan .................................. 63-118429

[51] Int. Cl.$^5$ ............................................. C23C 14/34
[52] U.S. Cl. ............................ 204/298.12; 204/298.13; 204/192.15
[58] Field of Search ................... 204/298 TS, 298 TC, 204/192.12, 192.15, 298.12, 298.13

[56] References Cited

U.S. PATENT DOCUMENTS

| 4,209,375 | 6/1980 | Gates et al. | 204/298 TS X |
| 4,430,190 | 2/1984 | Eilers et al. | 204/298 TS |
| 4,468,313 | 8/1984 | Okumura et al. | 204/298 TS |
| 4,569,745 | 2/1986 | Nagashima | 204/298 TS |

FOREIGN PATENT DOCUMENTS 59-179783 10/1984 Japan .
59-179784 10/1984 Japan .

Primary Examiner—Nam X. Nguyen
Attorney, Agent, or Firm—Foley & Lardner, Schwartz, Jeffery, Schwaab, Mack, Blumenthal & Evans

[57] ABSTRACT

A sputtering target divided into respective target elements of two or more types arranged as a composite on a substrate, is disclosed. A thin sheet whose constituent material comprises one or more of the constituent materials of the target elements, and whose constituent material includes at least one metal material, is interposed between said substrate and target elements.

14 Claims, 2 Drawing Sheets

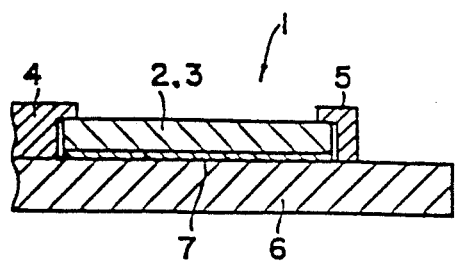
Fig.1
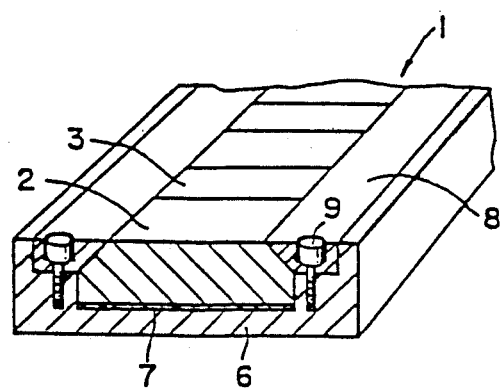
Fig.2
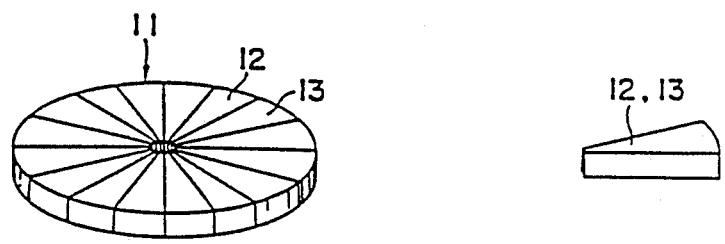
Fig.3
Fig.4

SPUTTERING TARGET

Background of the Invention

This invention relates to a sputtering target, and in particular relates to an improvement in a composite sputtering target divided into target elements of a plurality of types arranged on a substrate.

Conventionally, the sputtering technique has been widely used as a technique for forming thin films on specific substrates. Apart from thin films consisting of a single constituent, various attempts have been made to form thin films of composite constituents, such as alloys. In such sputtering techniques, use is made of a composite sputtering target, which is divided into a plurality of respective constituents (see for example, early Japanese patent publication No. SHO.59-179783, of the present applicants). Such composite sputtering targets are used for example when it is difficult to produce a target having a composition ratio that departs beforehand from the stoichiometric amounts and yet which has a uniform composition, as for example with molybdenum and silicon, or in the case where there is a large difference between the melting points or vapor pressures, making it difficult to produce an alloy target body of the prescribed composition ratio.

Known forms of such composite target include disc-shaped targets formed by assembling a plurality of wedge-shaped target elements arranged alternately, or targets in the form of a rectangular plate, consisting of an alternate arrangement of strip-shaped target elements.

Examples of commonly used sputtering targets that are composite targets are shown in FIGS. 3 to 7. As shown in FIG. 3, a composite target 11 consists of two types of target elements 12 and 13 assembled alternately in mosaic form to produce an integral disc-shaped composite target. In this case, target elements 12 and 13 are respectively fan-shaped as shown in FIG. 4. The composite target 11 is mechanically fixed (FIG. 6) onto a copper backing plate 16 constituting the substrate by an inner junk ring 14 and outer junk ring 15 shown in FIG. 5. The usual fixing method is clamping by means of screws. In more detail, an axial cross-section of FIG. 6 is shown in FIG. 7.

Film deposition using a composite sputtering target as described above has the advantage that the composition ratio of the film which is formed can be altered at will be altering the types of target elements and/or their combination.

However, with continuing use of a conventional composite target as described above, occasionally gaps are produced between the respective target elements 12 and 13. These gaps are formed by differences in the thermal expansion that results from heating of the target during use, and the repeated thermal distortion which this causes. In particular, such gaps are mostly produced towards the end of the life of the target. This results in the problem that, when sputtering is performed, the copper backing plate, which is the substrate, is sputtered from the gaps which are thus formed, at the same time as the sputtering of the target element metal. When this occurs, it is difficult to form a thin film of stable composition ratio, and there is a bad effect on the quality of VLSI products.

Summary of the Invention

It is therefore an object of the present invention to provide a composite sputtering target whereby film of stable quality can be deposited over a long period.

In accordance with these and other objects there is provided according to the invention a sputtering target divided into respective target elements of two or more types arranged as a composite on a substrate, and a thin sheet comprising one or more of the target element materials interposed between the substrate and target elements, wherein the thin sheet comprises at least one metal material.

Brief Description of the Drawings

FIG. 1 is a cross-sectional view of a sputtering target according to an embodiment of this invention.

FIG. 2 is a perspective view of a sputtering target according to an embodiment of this invention.

FIG. 3 to FIG. 6 are perspective views showing the construction of prior art sputtering targets.

Detailed Description of the Preferred Embodiments

Figure 5:
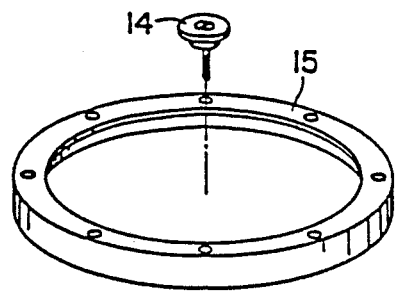

The sputtering target of this invention is characterized by the interposition of a thin sheet between the substrate and the target elements. The material of this thin sheet in the invention is one of the constituent materials of the composite target, or a mixture thereof and comprises at least one metal material.

Preferably, the thin sheet in this invention consists of a high-melting-point metal of high purity that is used in the composite target. For example, when a high-melting-point metal silicide film is formed, it is very advantageous if this thin sheet consists of a high-melting-point metal, since contamination due to metals such as Na, K, Cu, Fe, Ni, or Cr, which have an extremely adverse effect on the performance of VLSI gate electrodes and wiring electrodes when mixed in the high-melting-point metal silicide, can then be effectively prevented. For example, purity is preferably higher than 99.99%. As high-melting-point metal, there are Mo, W and Ta, etc., for example. Also, the fact that the thin sheet consists of material of excellent ductility and excellent thermal conductivity is advantageous in preventing a rise of temperature of the composite target during sputtering. Examples of the metals constituting the sputtering target of this invention include Mo, W, Ta, Nb, Ti, Ni, V, Cr and Al, and examples of the alloys include various suitable combinations of these metals.

The thickness of the thin sheet will depend on the type of composite target. Normally, a range of about 0.05 to 0.6 mm is preferable, and about 0.1 to 0.5 mm is even more preferable. If the thickness of the thin sheet is less than about 0.05 mm, handling is difficult when the thin sheet is fixed between the composite target and the substrate. On the other hand, it is undesirable for the thickness to be greater than about 0.6 mm, since there is then likely to be poor adhesion between the composite target and the substrate, due to slight warping of the thin sheet, and cooling is insufficient.

The relationship between the thickness of the thin sheet and the results of sputtering is shown in the following Table.

TABLE

| | Thickness of thin sheet (mm) | Result of Sputtering | |
|---|---|---|---|
| | | combination of Mo and Si as sputtering target. Mo as thin sheet. | combination of Mo and Ta as sputtering target. Mo as thin sheet. |
| Example 1 | 0.03 | X occurence of cracks on Si target because of poor cooling. | △ deposited film has non-uniform thickness. |
| Example 2 | 0.08 | ○ deposited film has good uniformity of thickness until the end of operation of the sputtering target. | ○ deposited film has good uniformity of thickness until the end of operation of the sputtering target. |
| Example 3 | 0.20 | ⊙ deposited film has excellent uniformity of thickness until the end of operation of the sputtering target. | ⊙ deposited film has excellent uniformity of thickness until the end of operation of the sputtering target. |
| Example 4 | 0.40 | ⊙ deposited film has excellent uniformity of thickness until the end of operation of the sputtering target. | ⊙ deposited film has excellent uniformity of thickness until the end of operation of the sputtering target. |
| Example 5 | 0.55 | ○ deposited film has good uniformity of thickness until the end of operation of the sputtering target. | ○ deposited film has good uniformity of thickness until the end of operation of the sputtering target. |
| Example 6 | 1.00 | X deposited film has non-uniform thickness because of poor cooling. | X deposited film has non-uniform thickness because of poor cooling. |

X ... bad
△ ... poor
○ ... good
⊙ ... excellent

Figure 6:
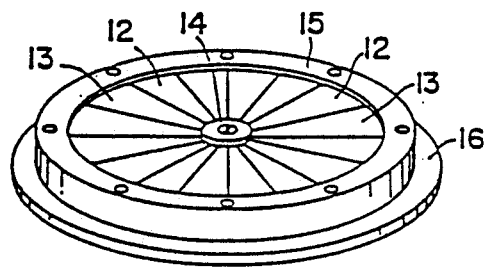
Figure 7:
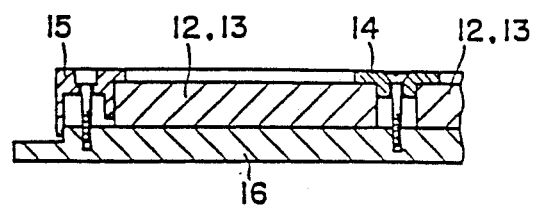
FIG. 7 is a cross-sectional view of a prior art sputtering target.

FIG. 1 is a cross-sectional view of sputtering target 1 according to an embodiment of this invention. In this instance, doughnut-shaped high-purity Mo thin sheet 7 (thickness 0.4 mm) of the same area as composite target 11 shown in FIG. 3 is mounted on, for example, a copper backing plate 6. Next, composite target elements 2, 3 consisting of a combination of materials of types that can be selected at will, for example, Mo and Ta, are mounted thereon. The combination of composite target elements 2 and 3 in this case should match the desired composition ratio. Sputtering target 1 according to this invention is obtained by fixing composite target elements 2 and 3 and Mo thin sheet 7 onto copper backing plate 6 using inner junk ring 4 and outer junk ring 5 in the same way as in FIG. 6.

In the above example, sputtering can be carried out in a stable manner over a long period without lowering of heat transmission between the composite target and substrate, or, in other words, without producing a rise in temperature of the composite target during sputtering, and an excellent deposited film is obtained, with no contamination.

FIG. 2 shows sputtering target 1 constituting another embodiment of this invention. In this example, the planar shape of sputtering target 1 as shown in the Figure is rectangular. This rectangular construction consists of an alternate arrangement of Mo target elements 2 and Ta target elements 3. Mo thin sheet 7 of thickness 0.2 mm is interposed between these target elements and cooling backing plate (Cu) 6 constituting the substrate. The whole assembly is fixed together by fixing jigs 8 and fixing bolts 9.

In this example also, there is no risk of contamination during sputtering, since exposure of the substrate from the joints between Mo target elements 2 and Ta target elements 3 cannot occur. Also, with the target of this invention, sputtering can be carried out up to the limit of the thickness of the target, so the efficiency of utilization of the target itself is increased, and costs can be reduced. Furthermore, in this invention, by restricting the thickness of the thin sheet to a fixed range, the cooling efficiency during sputtering is increased, so abnormal sputtering can be prevented in a safe and reliable manner.

In this invention, thanks to the introduction of a thin sheet comprising constituent material of the target element between the composite target element and the substrate, the deposited film that is obtained using this sputtering target is of excellent quality with no contamination. Also, sputtering can be performed in a stable manner over a long period, resulting in the benefits of improved efficiency of utilization of the target and reliability.

The foregoing description and examples have been set forth merely to illustrate the invention and are not intended to be limiting. Since modifications of the described embodiments incorporating the spirit and substance of the invention may occur to persons skilled in the art, the scope of the invention should be limited solely with reference to the appended claims and equivalents.

What is claimed is:

1. A sputtering target divided into respective target elements of two or more types arranged as a composite on a substrate, and a thin sheet consisting essentially of one or more of the materials of the target element interposed between said substrate and said target elements, wherein the thin sheet comprises at least one metal material.

2. A sputtering target according to claim 1, wherein the material of said target elements is selected from the group consisting of Mo, W, Ta, Nb, Ti, Ni, V, Cr, Al, and combinations thereof.

3. A sputtering target according to claim 1, wherein said target elements constitute a composite target consisting of Mo and Ta, and the material of said sheet is selected from Mo and Ta.

4. A sputtering target according to claim 1, wherein the thickness of said thin sheet is about 0.05 to 0.6 mm.

5. A sputtering target according to claim 1, wherein the thickness of said thin sheet is about 0.1 to 0.55 mm.

6. A sputtering target according to claim 1, wherein the thin sheet comprises a metal of high purity.

7. A sputtering target according to claim 1, wherein the thin sheet comprises a metal having a purity greater than about 99.99%.

8. A sputtering target comprising:
   a substrate;
   a plurality of target elements arranged on the substrate, and;
   a thin sheet interposed between the substrate and the target elements and comprising at least one of the materials of the target elements, wherein the thin sheet comprises at least one metal material.

9. A sputtering target as claimed in claim 8, wherein the thin sheet comprises a high-meltingpoint metal of high purity.

10. A sputtering target as claimed in claim 8, wherein the material of the thin sheet is selected from the group consisting of Mo, W, Ta, Nb, Ti, Ni, V, Cr, Al and combinations thereof.

11. A sputtering target as claimed in claim 8, wherein the target elements comprise Mo and Ta and the material of the thin sheet is selected from Mo and Ta.

12. A sputtering target as claimed in claim 8, wherein the thickness of the thin sheet is about 0.05 to 0.6 mm.

13. A sputtering target as claimed in claim 8, wherein the thickness of the thin sheet is about 0.1 to 0.5 mm.

14. A sputtering target according to claim 8 wherein the thin sheet comprises a metal having a purity greater than about 99.99%.

* * * * *